(12) United States Patent
Sung et al.

(10) Patent No.: US 7,864,299 B2
(45) Date of Patent: Jan. 4, 2011

(54) APPARATUS FOR SUPPORTING A WAFER, APPARATUS FOR EXPOSING A WAFER AND METHOD OF SUPPORTING A WAFER

(75) Inventors: Jae-Hyun Sung, Hwaseong-si (KR); Jong-Min Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 696 days.

(21) Appl. No.: 11/889,871

(22) Filed: Aug. 17, 2007

(65) Prior Publication Data
US 2008/0068582 A1 Mar. 20, 2008

(30) Foreign Application Priority Data
Aug. 17, 2006 (KR) .................... 10-2006-0077762

(51) Int. Cl.
G03B 27/58 (2006.01)
G03B 27/52 (2006.01)
G03B 27/42 (2006.01)
G03B 27/60 (2006.01)
G03B 27/62 (2006.01)

(52) U.S. Cl. .................... 355/72; 355/30; 355/53; 355/73; 355/75

(58) Field of Classification Search .................... 355/30, 355/53, 72–77; 269/11; 414/222.01; 174/98, 174/109, 107; 248/510, 542, 543; 250/453.11, 250/442.11, 492.1, 492.2, 492.22, 548; 361/234, 361/230; 378/34, 35
See application file for complete search history.

(56) References Cited

U.S. PATENT DOCUMENTS

| | | | | |
|---|---|---|---|---|
| 4,502,094 A * | 2/1985 | Lewin et al. | ................ | 361/234 |
| 5,919,332 A * | 7/1999 | Koshiishi et al. | ....... | 156/345.47 |
| 6,392,738 B1 * | 5/2002 | van de Pasch et al. | ......... | 355/30 |
| 6,413,701 B1 * | 7/2002 | van Empel et al. | .......... | 430/320 |
| 6,423,176 B1 * | 7/2002 | Ito et al. | ................ | 156/345.47 |
| 6,664,492 B1 * | 12/2003 | Babb et al. | ................ | 209/127.1 |
| 6,781,673 B2 * | 8/2004 | Moors et al. | ................ | 355/76 |
| 2002/0135967 A1 * | 9/2002 | Fuwa et al. | ................ | 361/234 |
| 2003/0071631 A1 * | 4/2003 | Alexander | ................ | 324/500 |
| 2004/0040665 A1 * | 3/2004 | Mizuno et al. | ......... | 156/345.51 |
| 2004/0218157 A1 * | 11/2004 | Bakker et al. | ................ | 355/30 |
| 2006/0043065 A1 * | 3/2006 | Buchberger et al. | .......... | 216/63 |
| 2006/0072085 A1 * | 4/2006 | Compen et al. | ................ | 355/30 |
| 2009/0033889 A1 * | 2/2009 | Bleeker et al. | ................ | 355/30 |

FOREIGN PATENT DOCUMENTS

| | | |
|---|---|---|
| JP | 08-167643 | 6/1996 |
| JP | 2000-077509 | 3/2000 |
| KR | 1999-0000510 | 1/1999 |

\* cited by examiner

*Primary Examiner*—Peter B Kim
*Assistant Examiner*—Christina Riddle
(74) *Attorney, Agent, or Firm*—Harness, Dickey & Pierce, P.L.C.

(57) ABSTRACT

In an apparatus for supporting a wafer, the apparatus may remove particles thereon. The apparatus may include a conductive support configured to support the wafer, and a power source electrically connected to the conductive support, the power source configured to provide at least one current to the conductive support to remove particles from the conductive support.

20 Claims, 9 Drawing Sheets

APPARATUS FOR SUPPORTING A WAFER, APPARATUS FOR EXPOSING A WAFER AND METHOD OF SUPPORTING A WAFER

PRIORITY CLAIM

A claim of priority is made under 35 USC §119 to Korean Patent Application No. 2006-77762 filed on Aug. 17, 2006, the contents of which are herein incorporated by reference in their entirety for all purposes.

BACKGROUND

1. Field

Example embodiments may relate to an apparatus for supporting a wafer and a method of supporting a wafer.

2. Description of the Related Art

After loading a wafer on a stage, patterns of a reticle may be transferred to the wafer during an exposure process. During the exposure process, particles may accumulate on the stage, and areas of the wafer above the particles may be convex. As a degree of integration in a semiconductor device increases, a focus margin in the exposure process may also decrease. Accordingly, defocusing may occur at the convex portion of the wafer when the wafer is exposed. Thus, the reticle patterns may not be accurately transferred to the wafer and/or the quality of a semiconductor device may be deteriorated.

SUMMARY

Example embodiments may provide an apparatus for supporting a wafer and the apparatus may be capable of removing particles thereon.

Example embodiments may also provide an apparatus used to expose a wafer having the apparatus for supporting a wafer.

Example embodiments may provide a method of removing particles from an apparatus for supporting a wafer.

In an example embodiment, an apparatus for supporting a wafer may include a conductive support configured to support the wafer, and a power source electrically connected to the conductive support, the power source configured to provide at least one current to the conductive support to remove particles from the conductive support.

In another example embodiment, a method may include detecting particles on the supporting apparatus and removing the particles by providing at least one current to the conductive support.

BRIEF DESCRIPTION OF THE DRAWINGS

The above and other features of example embodiments may become more apparent with reference to the detailed example embodiments thereof with reference to the accompanying drawings, in which.

DESCRIPTION OF EXAMPLE EMBODIMENTS

Figure 1:
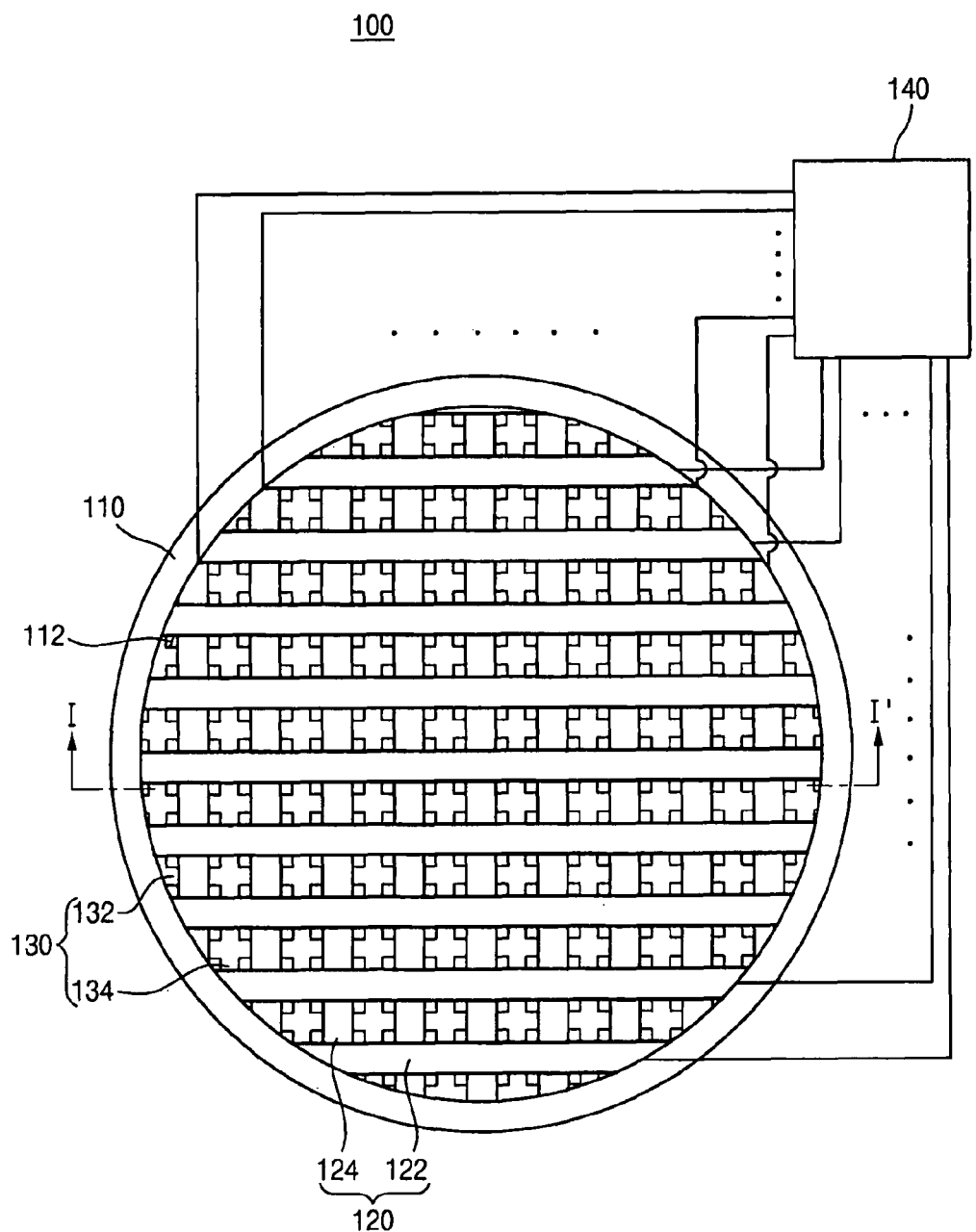
FIG. 1 is a top view illustrating an apparatus for supporting a wafer in accordance with example embodiments.

Example embodiments may be described more fully hereinafter with reference to the accompanying drawings, in which example embodiments of the present invention are shown. Example embodiments may, however, be embodied in many different forms and should not be construed as limited to example embodiments set forth herein. Rather, example embodiments are provided so that this disclosure may be thorough, and will convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present application.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present application.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
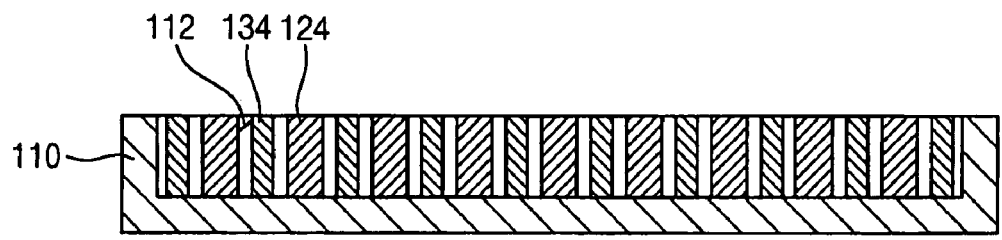
FIG. 2 is an example cross-sectional view of the apparatus for supporting the wafer taken along a line I-I' in FIG. 1.

FIG. 1 is a top view illustrating an apparatus for supporting a wafer in accordance with example embodiments, and FIG. 2 is an example cross-sectional view of the apparatus for supporting the wafer taken along a line I-I' in FIG. 1.

Referring to FIGS. 1 and 2, an apparatus 100 for supporting a wafer may include a plate 110, a conductive support 120, an insulating support 130, and/or a power source 140.

The plate 110 may have a recess 112. The recess 112 may have a diameter slightly smaller than that of a wafer (not shown). The plate 110 may support the wafer at its periphery, for example, edge. The plate 110 may include an insulating material.

The conductive support 120 may have a cross-striped shape and may be inserted in the recess 112. The conductive support 120 may support the wafer at its central portion. The conductive support 120 may also include a conductive material.

The conductive support 120 may include a plurality of first conductive lines 122 and a plurality of second conductive lines 124. The plurality of first conductive lines 122 may be disposed in parallel with respect to each other and at a first distance with respect to each other. The plurality of second conductive lines 124 may also be disposed in parallel with respect to each other and at a second distance with respect to each other. Additionally, the plurality of first conductive lines 122 may be disposed perpendicular with the plurality of second conductive lines 124. In an example embodiment, the plurality of first and second conductive lines 122 and 124 may not be electrically connected to each other. The first distance may be different from or substantially the same as the second distance. In an example embodiment, the first distance is substantially the same as the second distance.

Figure 3:
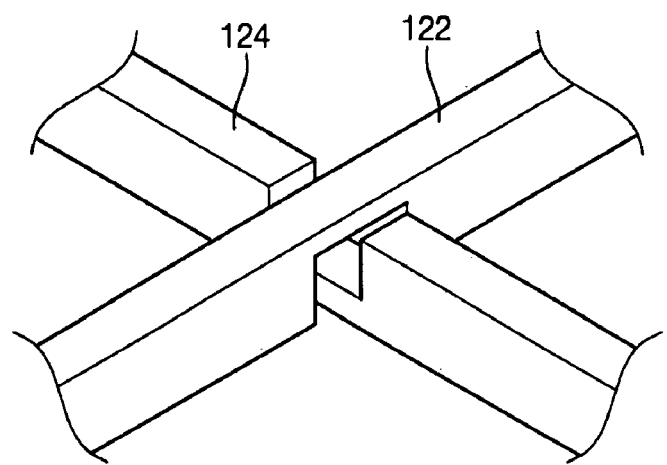
FIG. 3 is an example perspective view illustrating an intersection at which first and second conductive lines illustrated in FIG. 1 cross each other.

FIG. 3 is an example perspective view illustrating an intersection at which one of the plurality of first and second conductive lines illustrated in FIG. 1 cross each other, but do not contact each other.

As illustrated in FIG. 3, the first and second conductive lines 122 and 124 may not contact each other at the intersection. Accordingly, the plurality of first and second conductive lines 122 and 124 are not electrically connected to each other.

The insulating support 130 may have a cross-striped (or lattice) shape and may be inserted in the recess 112. The insulating support 130 may support the wafer. The insulating support 130 may include an insulating material.

The insulating support 130 may include a plurality of first insulating lines 132 and a plurality of second insulating lines 134. The plurality of first insulating lines 132 may be disposed in first spaces between the plurality of first conductive lines 122. In an example embodiment, the plurality of first insulating lines 132 may partially fill the first spaces and insulate the plurality of first conductive lines 122 from each other. The plurality of second insulating lines 134 may be disposed in second spaces between the plurality of second conductive lines 124. In an example embodiment, the plurality of second insulating lines 134 may partially fill the second spaces and insulate the plurality of second conductive lines 124 from each other. Thus, the insulating support 130 may reduce or prevent current from flowing between the plurality of first and second conductive lines 122 and 124.

Alternatively, the plurality of first insulating lines 132 may sufficiently fill the first spaces, and the plurality of second insulating lines 134 may sufficiently fill the second spaces.

In an example embodiment, the plurality of first and second conductive lines 122 and 124 may have a first width greater than a second width of the plurality of first and second insulating lines 132 and 134. When a size of particles is greater than a given particular size, those particles may be disposed only on the plurality of first and second conductive lines 122 and 124, or lay across the plurality of first and second conductive lines 122 and 124 and the plurality of first and second insulating lines 132 and 134. When a size of particles are smaller than a given particular size, those particles may be disposed on the plurality of first and second conductive lines 122 and 124, because the plurality of conductive lines 122 and 124 may have areas larger than those of the plurality of insulating lines 132 and 134. Additionally, when particles are relatively small, the particles may not affect the wafer when it is loaded onto the apparatus 100. Thus, when particles are disposed on the apparatus 100, removing the particles from the plurality of conductive lines 122 and 124 may be more important than removing the particles from the plurality of insulating lines 132 and 134.

In another example embodiment, the plurality of first and second conductive lines 122 and 124 may have a first width substantially the same as a second width of the plurality of first and second insulating lines 132 and 134.

The conductive support 120 and the insulating support 130 may have a height substantially similar to that of the plate 110. Thus, the plate 110, the conductive support 120, and the insulating support 130 may evenly support the wafer.

The power source 140 may be connected to the conductive support 120. The power source 140 may be connected to a first end of the plurality of first conductive lines 122 and a first end of the plurality of second conductive lines 124. Second ends of the plurality of first conductive lines 122 and the plurality of second conductive lines 124 may be connected to ground. The power source 140 may provide at least one current to the plurality of first and second conductive lines 122 and 124. Particles disposed on the plurality of first and second conductive lines 122 and 124 may be burned-off by the at least one current, thereby removing the particles.

The apparatus 100 may remove particles from the plurality of first conductive lines 122 and/or the plurality of second conductive lines 124 electrically, for example, by at least one current. Additionally, the current(s) provided to the plurality of conductive lines 122 and 124 may be selectively provided so that the power source 140 may consume less power.

Figure 4:
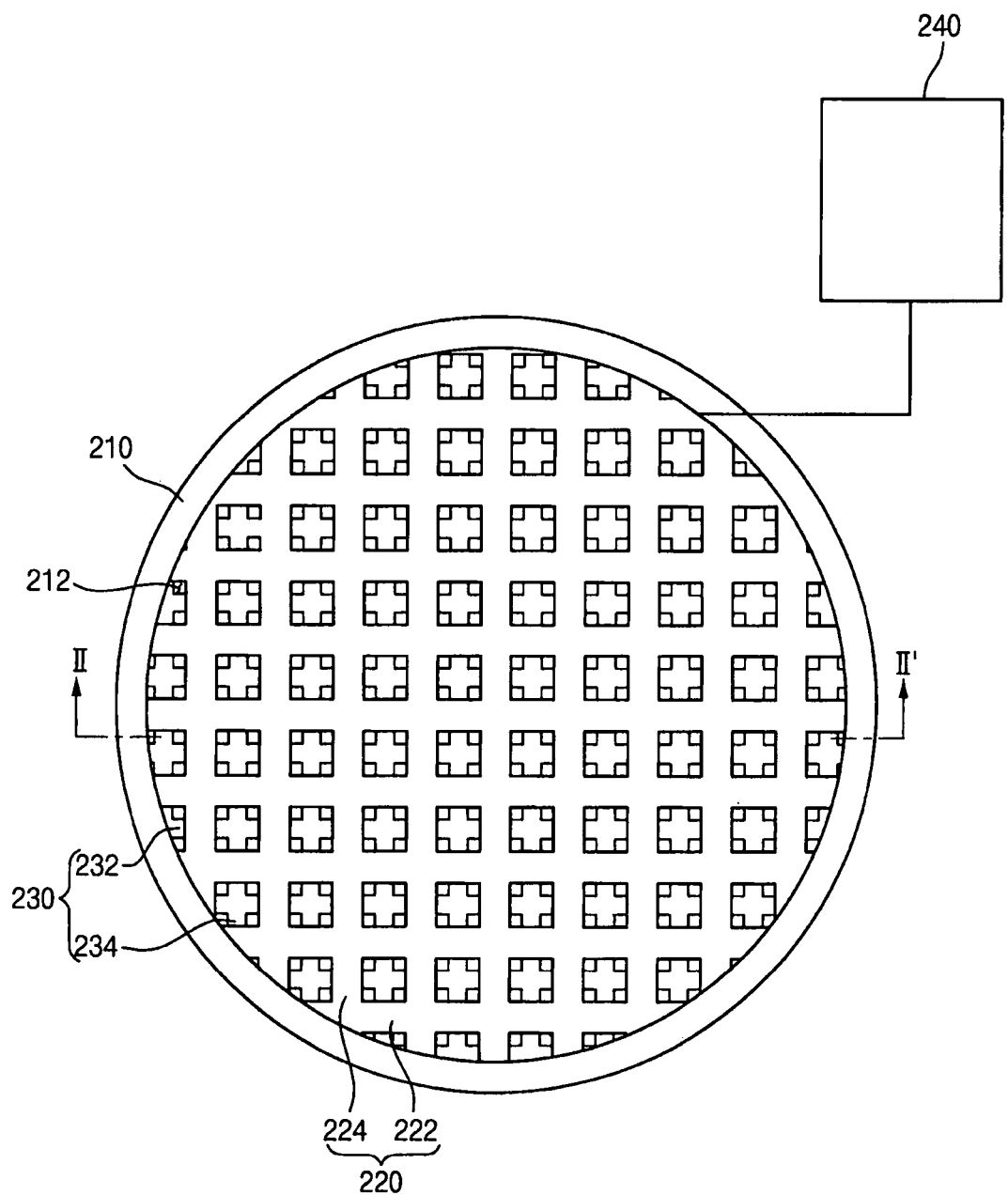
FIG. 4 is a top view illustrating an apparatus for supporting a wafer in accordance with example embodiments.
Figure 5:
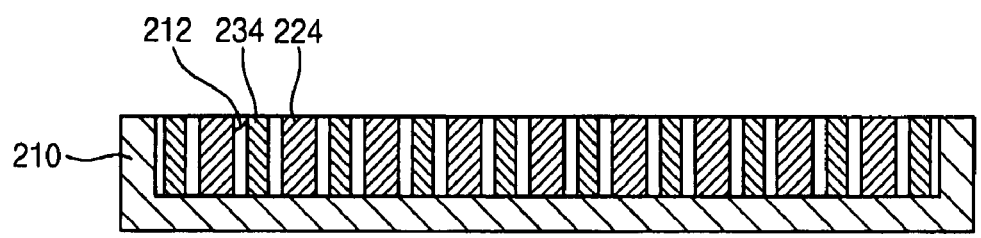
FIG. 5 is an example cross-sectional view of the apparatus for supporting the wafer taken along a line II-II' in FIG. 4.
Figure 6:
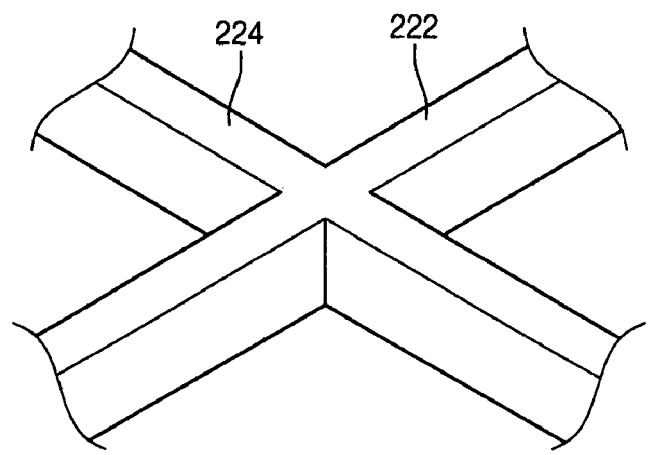
FIG. 6 is an example perspective view illustrating an intersection at which first and second conductive lines illustrated in FIG. 4 cross each other.

FIG. 4 is an example top view illustrating an apparatus for supporting a wafer in accordance with example embodiments. FIG. 5 is an example cross-sectional view of the apparatus for supporting the wafer taken along a line II-II' in FIG. 4. FIG. 6 is an example perspective view illustrating an intersection at which first and second conductive lines illustrated in FIG. 4 cross and contact each other.

Referring to FIGS. 4 to 6, an apparatus 200 may include a plate 210, a conductive support 220, an insulating support 230, and/or a power source 240.

The apparatus 200 may be substantially the same as the apparatus 100 illustrated in FIG. 1 except for an intersection at which the plurality of first and second conductive lines 222 and 224 cross each other and a connection state between the power source 240 and the conductive support 220.

As illustrated in FIG. 6, the plurality of first conductive lines 222 and the plurality of second conductive lines 224 may contact each other at an intersection. Thus, the plurality of first and second conductive lines 222 and 224 may be electrically connected to each other.

The power source 240 may be connected to one end of the conductive support 220. The power source 240 may be connected to any one end of either the plurality of first and/or second conductive lines 222 and 224, because the plurality of first and second conductive lines 222 and 224 are electrically connected to each other. An end of the conductive support 220 not connected to the power source 240 may be connected to ground.

The apparatus 200 may remove particles from the conductive support 220 by providing at least one current to the conductive support 220 regardless of the location of the particles.

Figure 7:
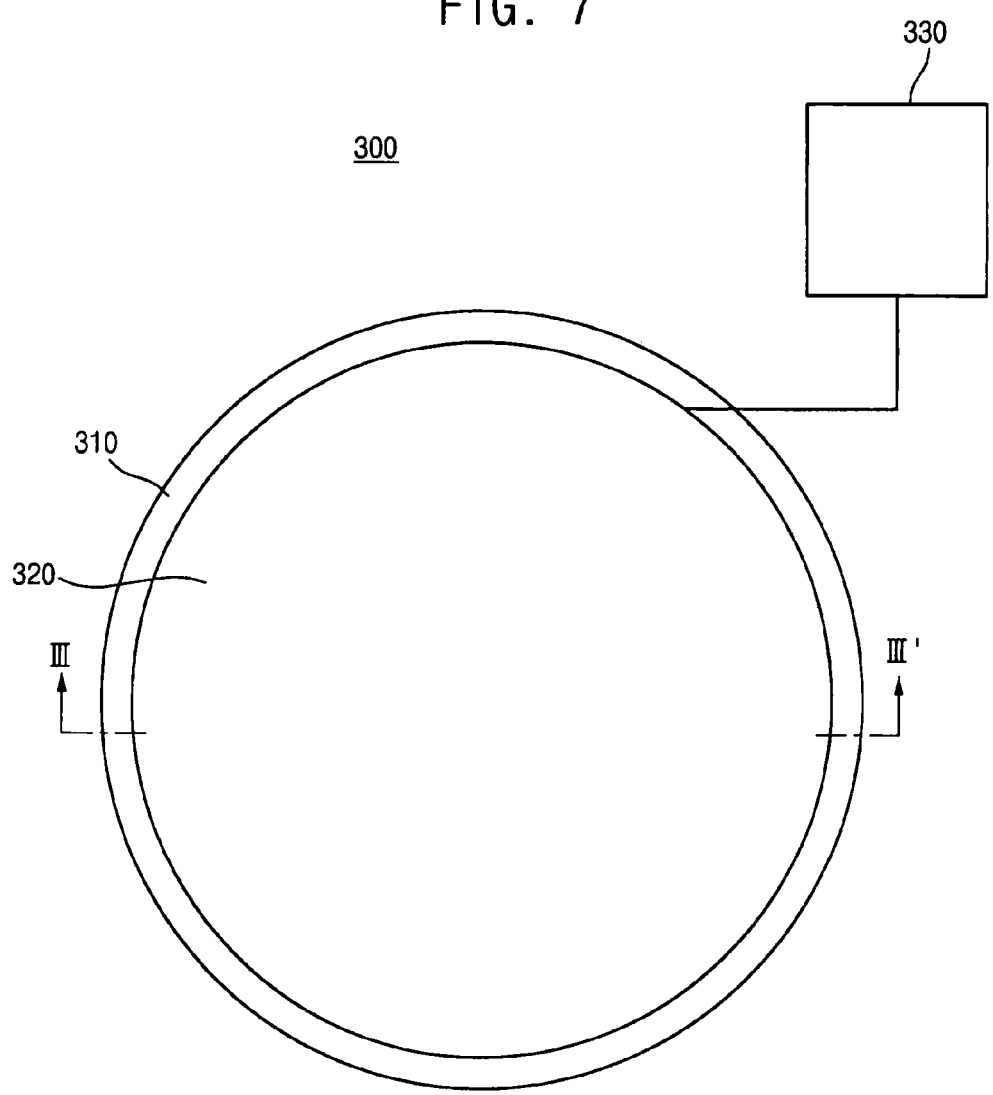
FIG. 7 is a top view illustrating an apparatus for supporting a wafer in accordance with still another example embodiment of the present invention.
Figure 8:
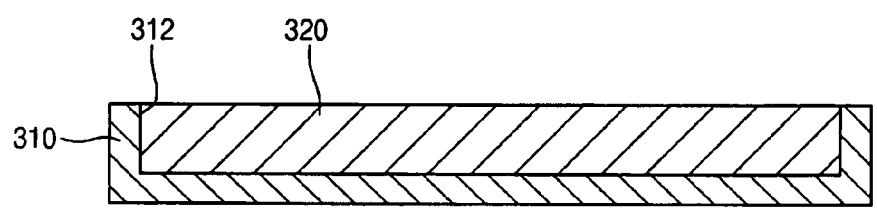
FIG. 8 is an example cross-sectional view of the apparatus for supporting the wafer taken along a line III-III' in FIG. 7.

FIG. 7 is a top view illustrating an apparatus for supporting a wafer in accordance with example embodiments. FIG. 8 is an example cross-sectional view of the apparatus for supporting the wafer taken along a line III-III' in FIG. 7.

Referring to FIGS. 7 and 8, an apparatus 300 may include a plate 310, a conductive support 320, and/or a power source 330.

The plate 310 may have a recess 312 at an upper portion thereof. The recess 312 may have a diameter slightly smaller than that of a wafer (not shown). The plate 310 may support a wafer at its periphery, for example, edge. The plate 310 may include an insulating material.

The conductive support 320 may have a circular shape, for example, a cylindrical or disk shape, and may be inserted into the recess 312. The conductive support 320 may have a diameter substantially the same as that of the recess 312. The conductive support 320 may support a wafer at its central portion. The conductive support 320 may include a conductive material.

The conductive support 320 may have a height substantially the same as that of the plate 310. Thus, the plate 310 and the conductive support 320 may evenly support the wafer.

The power source 330 may be connected to the conductive support 320. The power source 330 may be connected to a first end of the conductive support 320. A second end of the support 320 may be connected to ground. The power source 330 may provide at least one current to the conductive support 320. Particles disposed on the conductive support 320 may be burned-off by the at least one current, thereby removing the particles from the apparatus 300.

The apparatus 300 may remove particles from the conductive support 320 by providing at least one current to the conductive support 320 regardless of the location of the particles.

Figure 9:
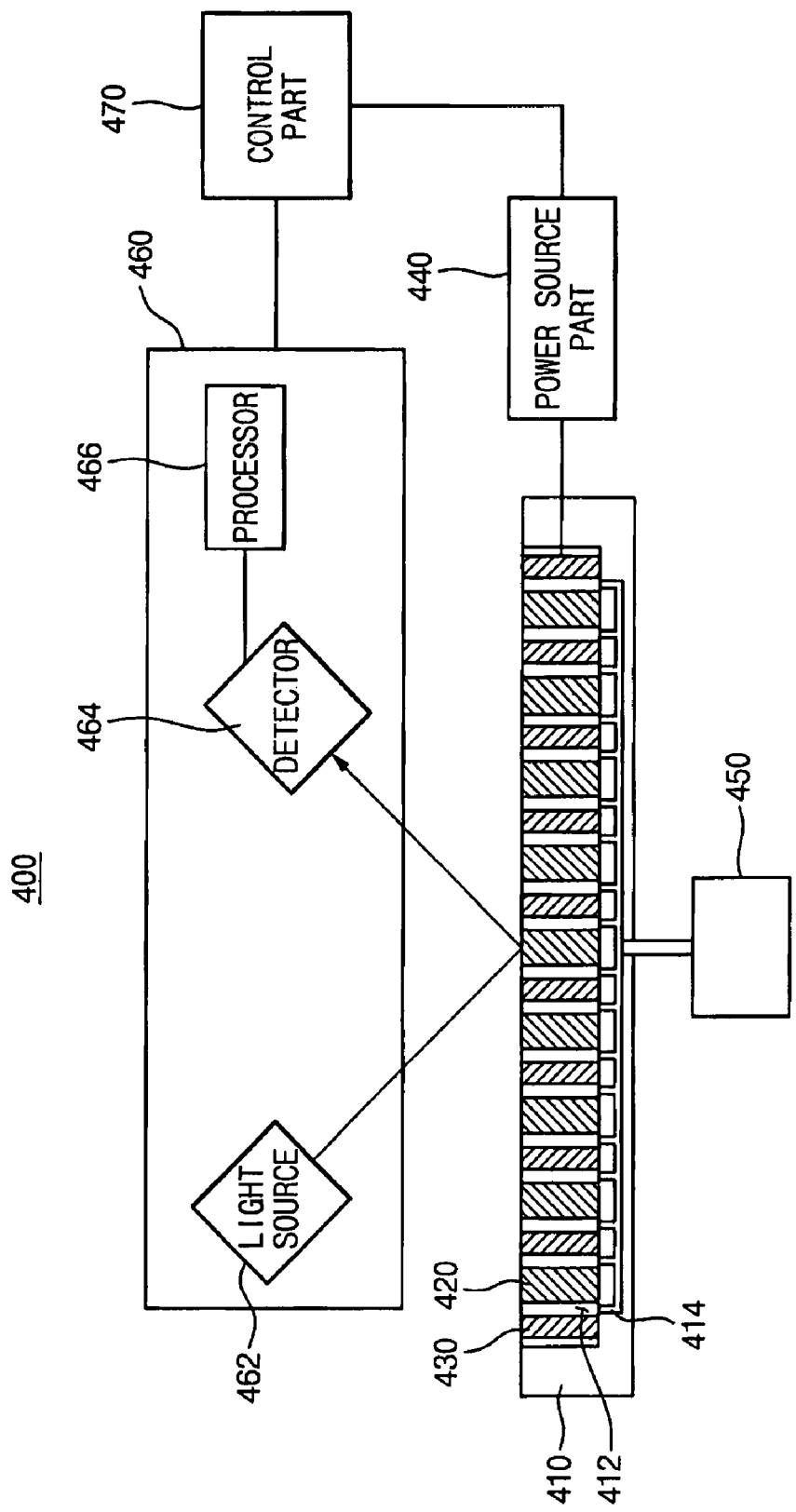
FIG. 9 is an example cross-sectional view illustrating an apparatus for removing particles in accordance with an example embodiment of the present invention.
Figure 10:
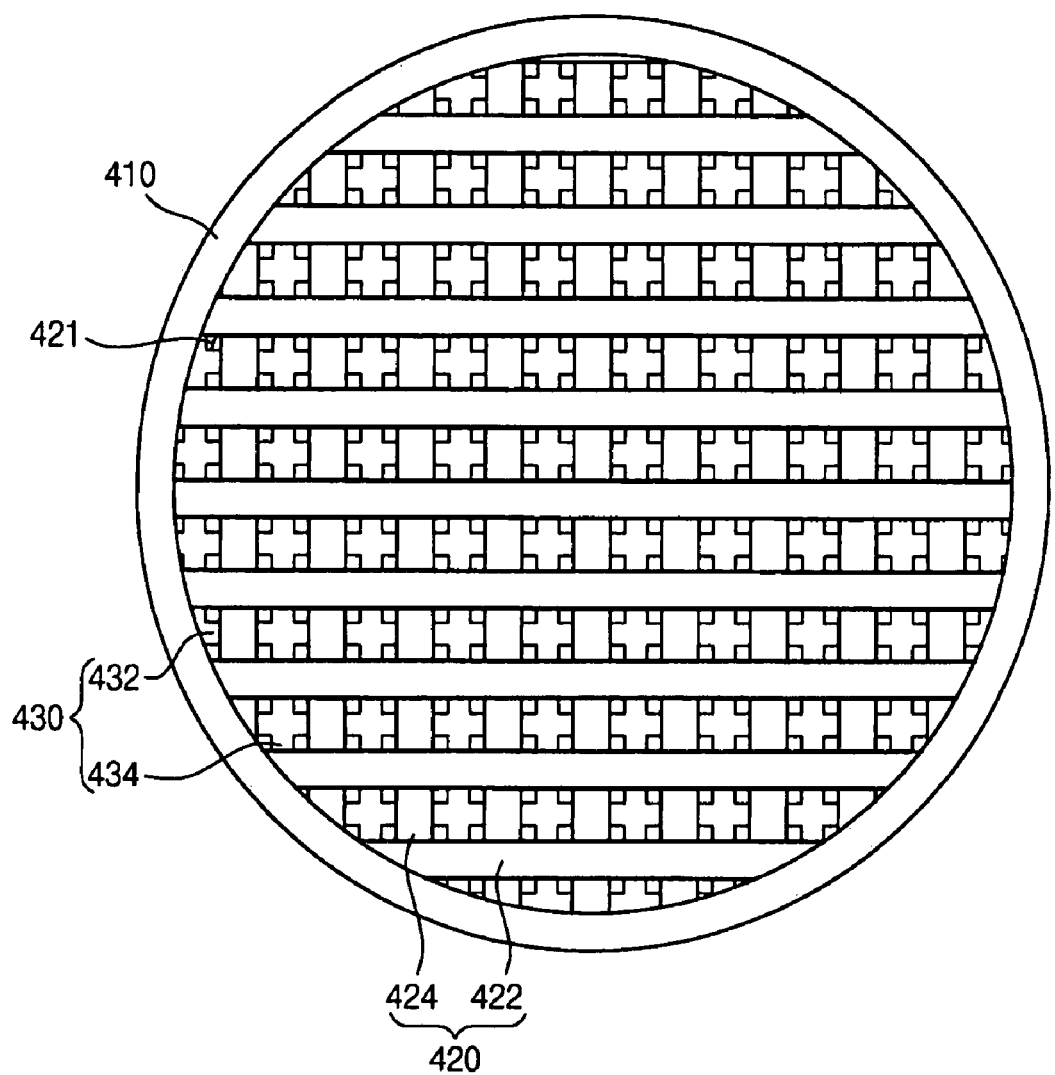
FIG. 10 is an example top view illustrating a plate part, a conductive supporting part and an insulating supporting part in FIG. 9.

FIG. 9 is a cross-sectional view illustrating an apparatus for removing particles in accordance with example embodiments and FIG. 10 is an example top view illustrating a plate part, a conductive supporting part and an insulating supporting part in FIG. 9.

Referring to FIGS. 1, 4, and 10, an apparatus 400 for removing particles may includes a plate part 410, a conductive supporting part 420, an insulating supporting part 430, a power source 440, a vacuum supplying part 450, a detection part 460, and/or a controller 470.

The plate part 410, the conductive supporting part 420, the insulating supporting part 430, and the power source 440 may be substantially the same as those illustrated in FIGS. 1 to 3, 4 and 7 and disclosed above, thus, detailed explanations of similar elements are omitted here in order to avoid repetition.

The vacuum supplying part 450 may be connected to a plurality of vacuum conduits 414. The vacuum conduits 414 may be in fluid connection with spaces between the conductive supporting part 420 and the insulating supporting part 430. When a wafer is loaded on the plate part 410, the vacuum supplying part 450 may provide vacuum to the spaces via the vacuum conduits 414 so that the wafer may be fixed onto the plate part 410.

The spaces between the conductive supporting part 420 may be filled with the insulating supporting part 430 so that the wafer may not be bent by the vacuum.

The detection part 460 may be disposed over the conductive supporting part 420 and may detect particles on the conductive supporting part 420.

For example, the detection part 460 may include a light source 462, a detector 464, and/or a processor 466. The light source 462 may project light on the conductive supporting part 420. The detector 464 may detect light reflected or diffused from the conductive supporting part 420. The processor 466 may detect the particles by using the detected light. Additionally, the processor 466 may calculate locations of the particles when the particles are present.

The controller 470 may provide at least one current via the power source 140 to a portion of the conductive supporting part 420 on which the particles may be disposed, thereby removing the particles. For example, when the particles are disposed on a portion of the a plurality of first conductive lines 422 or a plurality of second conductive lines 424, the power source part 440 may provide at least one current to the plurality of first conductive lines 422 or the plurality of second conductive lines 424 in accordance with control provided by the controller 470.

The particles on the portion may be burned, thereby being removed.

The apparatus 400 may easily remove particles by providing at least one current to the portion of the apparatus 400 on which the particles may be disposed. Additionally, the current(s) provided for the conductive supporting part 420 may be selectively provided so that the power source part 440 may consume less power.

Figure 11:
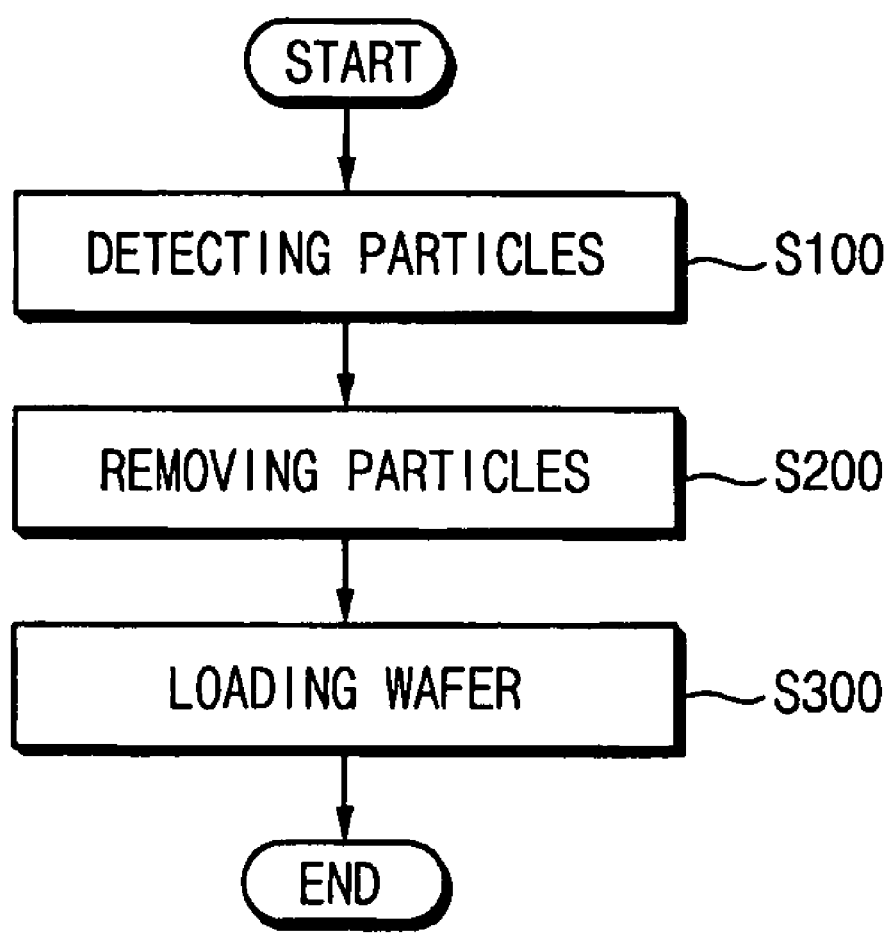
FIG. 11 is a flow chart illustrating a method of removing particles in accordance with example embodiments, for example, using the apparatus illustrated in FIG. 9.

FIG. 11 is a flow chart illustrating a method of removing particles in example embodiments, for example, using the apparatus 400 in illustrated in FIG. 9.

Referring to FIG. 101, at S100, particles on the conductive supporting part 420 may be detected by scanning the conductive supporting part 120.

For example, light may be projected to scan the conductive supporting part 420 so that the conductive supporting part 420 may be scanned. Light reflected or diffused from the conductive supporting part 420 may be detected. The presence of particles disposed on the conductive supporting part 420 may be confirmed using by the detected light. If the particles exist, the locations of the particles may be calculated.

At S200, at least one current may be provided to the location of the conductive supporting part 420 having the particles disposed thereon.

For example, when the particles are disposed on a portion of the plurality of first conductive lines 422 or the plurality of second conductive lines 424, the current(s) may be selectively provided to the plurality of first conductive lines 422 or the plurality of second conductive lines 424.

At S300, the particles may be removed from the conductive supporting part 420.

For example, the particles on the conductive supporting part 420 may be burned-off by energy from the current(s) provided to the conductive supporting part 420.

Figure 12:
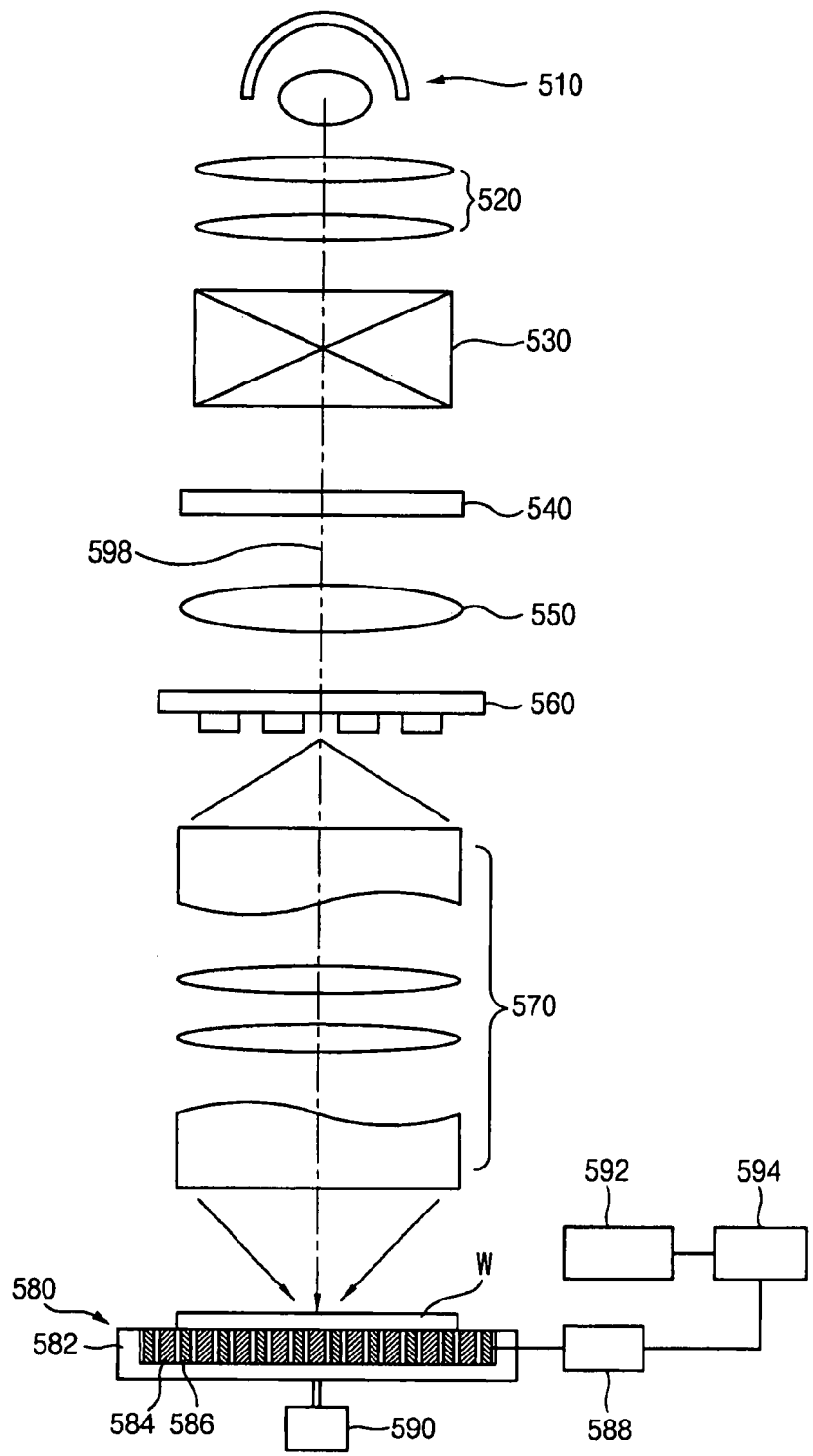
FIG. 12 is a block diagram illustrating an apparatus for exposing a wafer in accordance with example embodiments.

FIG. 12 is a block diagram illustrating an apparatus for exposing a wafer in accordance with example embodiments.

Referring to FIG. 12, an apparatus 500 for exposing a wafer may includes a light source 510, a condensing lens 520, a fly's eye lens array 530, an aperture plate 540, an illumination lens 550, a photo mask 560, a projection lens 570, and/or an apparatus 580 for supporting the wafer. A photoresist pattern may be formed on a wafer W by the apparatus 500.

The light source 510 may generate light that may be projected on the wafer W on which a photoresist layer (not shown) is formed. The light source 510 may include a lamp or a laser generating device. The light source 510 may generate a g-line light beam having a wavelength of 436 nm, an i-line light beam having a wavelength of 365 nm, a KrF laser beam having a wavelength of 248 nm generated from a KrF excimer laser, an ArF laser beam having a wavelength of 198 nm generated from ArF excimer laser, or an $F_2$ laser beam having a wavelength of 157 nm generated from $F_2$ excimer laser.

Reference numeral 598 may indicate an optical axis virtually connecting the light source 510 to a chosen portion of the wafer W. The optical axis 598 may pass along a center of the illumination lens 550 and a center of the projection lens 570.

The condensing lens 520 may condense the light generated by the light source 510.

The condensed light may be uniformly incident on an object by passing through the fly's eye lens array 530. The illumination lens 550 may condense the light having passed through the fly's eye lens array 530.

The light that having passed through the fly's eye lens array 530 may pass through the aperture plate 540 prior to reaching the illumination lens 550. The aperture plate 540 may be divided into an opening region (not shown) through which the light may pass and a blocking region (not shown) at which the light may be blocked from passing. The opening region may have a specific shape. The aperture plate 540 may transform the light generated by the light source 510 to off-axis light having a variety of poles.

The light having passed through the aperture plate 540 may be condensed by the illumination lens 550 and may be incident on the photo mask 560. Patterns transferred to the wafer W may be laid out in the photo mask 560. The light having passed through the photo mask 560 may pass through the projection lens 570 and focused on the wafer W loaded on the device 580. Thus, the patterns on the photo mask 560 may be transferred to the photoresist layer.

The device apparatus 580 for supporting the wafer may be substantially the same as the apparatus 400 for supporting the wafer illustrated in FIGS. 9 and 10.

Alternatively, the device 580 for supporting the wafer may be substantially the same as the apparatus 100, the apparatus 200, or the apparatus 300 in FIGS. 1 to 8.

The apparatus 500 for exposing the wafer may remove particles from the apparatus 580 and support the wafer W. Thus, defocusing may be reduced or prevented from being generated when a wafer W is exposed. Accordingly, patterns may be more precisely formed on the wafer W, and thus the quality of semiconductor devices manufactured by using the wafer W may be improved.

According to example embodiments, particles on a conductive supporting part on which a wafer is loaded may be more easily removed electrically, for example using at least one current. The particles may be removed by providing at least one current to the entire portion of the conductive supporting part, regardless of the locations of the particles. Alternatively, the particles may be removed by providing at least one current to a specific portion of the conductive supporting part on which the particles may be disposed. According to example embodiments, particles on a conductive supporting part on which a wafer is loaded may be removed by providing energy other than in electrical form.

Additionally, defocusing caused by the particles may be decreased because the wafer may be loaded and an exposure process is may be performed after the particles are removed.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of example embodiments. Therefore, it is to be understood that the foregoing is illustrative of example embodiments and is not to be construed as limited to the specific example embodiments disclosed, and that modifications to the disclosed example embodiments, as well as other example embodiments, are intended to be included within the scope of the appended claims. Example embodiments are defined by the following claims, with equivalents of the claims to be included therein.

What is claimed is:

1. An apparatus for supporting a wafer, the apparatus comprising:
    a conductive support configured to support the wafer, the conductive support includes:
        a plurality of first conductive lines provided in parallel with respect to each other and disposed at a first distance apart from each other; and
        a plurality of second conductive lines provided in parallel with respect to each other and disposed at a second distance apart from each other;

a power source electrically connected to the conductive support, the power source configured to provide at least one current to the conductive support to remove particles from the conductive support, and an insulating support for reducing or preventing current from flowing between the plurality of first and second conductive lines.

2. The apparatus of claim 1,
wherein the plurality of first conductive lines are disposed perpendicular to the plurality of second conductive lines.

3. The apparatus of claim 2, wherein the plurality of first conductive lines are not electrically connected to the plurality of second conductive lines, and wherein the power source selectively provides the at least one current to at least one of the plurality of first conductive lines and the plurality of second conductive lines.

4. The apparatus of claim 2, wherein the plurality of first conductive lines are electrically connected to the plurality of second conductive lines, and wherein the power source is configured to provide the at least one current to at least one of the plurality of first conductive lines and the plurality of second conductive lines.

5. The apparatus of claim 2, wherein the first distance is substantially same as the second distance.

6. The apparatus of claim 2,
wherein the insulating support includes a plurality of first insulating lines and a plurality of second insulating lines, wherein the plurality of first insulating lines are disposed in first spaces formed between the plurality of first conductive lines, and the plurality of second insulating lines are disposed in second spaces formed between the plurality of second conductive lines.

7. The apparatus of claim 6, wherein a width of the plurality of first and second conductive lines is larger than a width of the plurality of first and second insulating lines.

8. The apparatus of claim 6, wherein a height of the conductive support is substantially similar to a height of the insulating support.

9. The apparatus of claim 1, further comprising;
a plate configured to surround the conductive support and to support an edge of the wafer.

10. The apparatus of claim 9, wherein a height of the conductive support is substantially similar to a height of the plate.

11. The apparatus of claim 9, wherein the plate comprises an insulating material.

12. The apparatus of claim 1, further comprising:
a light source configured to generate light and project the light onto the conductive support; and
a detector configured to detect the light reflected or diffused off the conductive support.

13. The apparatus of claim 12, further comprising:
a processor configured with the detector to detect a location of the particles on the conductive support based on the detected light; and
a controller configured with the processor and the power source to control the power source to supply the at least one current to the conductive support.

14. The apparatus of claim 1, further comprising:
a vacuum source; and
a plurality of conduits connected to the vacuum source on one end and connected to the conductive support on the other end, wherein the vacuum source creates vacuum via the plurality of conduits to fix the wafer to the conductive support.

15. An exposing apparatus comprising:
the supporting apparatus of claim 1;
a light source configured to generate and project light onto the wafer supported by the supporting apparatus;
a condensing lens configured to condense the light generated by the light source; and
a photo mask having a pattern, the light passing through the photo mask to transfer the pattern to the wafer.

16. A method, comprising:
detecting particles on a conductive support configured to support a wafer;
removing the particles by providing at least one current to the conductive support, wherein the conductive support includes:
a plurality of first conductive lines provided in parallel with respect to each other and disposed at a first distance apart from each other; and
a plurality of second conductive lines provided in parallel with respect to each other and disposed at a second distance apart from each other, and
an insulating support for reducing or preventing current from flowing between the plurality of first and second conductive lines.

17. The method of claim 16, wherein the particles are detected by projecting light onto the conductive support and detecting reflected or diffused light off the conductive support.

18. The method of claim 16, further comprising:
loading a wafer onto the conductive support; and
transferring patterns onto the wafer using an exposing apparatus.

19. The apparatus of claim 6, wherein the plurality of first insulating lines partially fill the first space and insulate the plurality of first conductive lines.

20. The apparatus of claim 6, wherein the plurality of second insulating lines partially fill the second space and insulate the plurality of second conductive lines.

* * * * *